United States Patent
Wieczorek et al.

(10) Patent No.: US 6,875,676 B2
(45) Date of Patent: Apr. 5, 2005

(54) METHODS FOR PRODUCING A HIGHLY DOPED ELECTRODE FOR A FIELD EFFECT TRANSISTOR

(75) Inventors: Karsten Wieczorek, Dresden (DE); Falk Graetsch, Dresden (DE); Gunter Grasshoff, Radebeul (DE)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 10/359,980

(22) Filed: Feb. 6, 2003

(65) Prior Publication Data

US 2004/0016974 A1 Jan. 29, 2004

(30) Foreign Application Priority Data

Jul. 29, 2002 (DE) .......................... 102 34 488

(51) Int. Cl.[7] .............................................. H01L 21/20
(52) U.S. Cl. ...................... 438/585; 438/303; 438/560; 438/582
(58) Field of Search ................ 438/300–309, 438/284, 484, 585

(56) References Cited

U.S. PATENT DOCUMENTS

| 4,914,046 | A | | 4/1990 | Tobin et al. |
| 5,567,638 | A | | 10/1996 | Lin et al. |
| 5,885,877 | A | | 3/1999 | Gardner et al. ............. 438/300 |
| 5,998,271 | A | * | 12/1999 | Schwalke ................... 438/301 |
| 6,017,808 | A | | 1/2000 | Wang et al. ................ 438/528 |
| 6,380,055 | B2 | * | 4/2002 | Gardner et al. ............. 438/585 |

FOREIGN PATENT DOCUMENTS

JP 10163485 A 6/1998 .......... H01L/29/78

* cited by examiner

*Primary Examiner*—Dung A. Le
(74) *Attorney, Agent, or Firm*—Williams, Morgan & Amerson, P.C.

(57) ABSTRACT

A highly localized diffusion barrier is incorporated into a polysilicon line to allow the doping of the polysilicon layer without sacrificing an underlying material layer. The diffusion barrier is formed by depositing a thin polysilicon layer and exposing the layer to a nitrogen-containing plasma ambient. Thereafter, the deposition is resumed to obtain the required final thickness. Moreover, a polysilicon line is disclosed, having a highly localized barrier layer.

24 Claims, 3 Drawing Sheets

METHODS FOR PRODUCING A HIGHLY DOPED ELECTRODE FOR A FIELD EFFECT TRANSISTOR

BACKGROUND OF THE INVENTION

1. Field of the Invention

The present invention generally relates to the manufacture of semiconductor structures, and more particularly, to the fabrication of doped crystalline silicon (polysilicon) regions or lines used, for example, as gate electrodes in field effect transistors.

2. Description of the Related Art

Feature sizes of integrated circuits, such as CMOS (complementary metal-oxide semiconductor) transistors are steadily scaled into the deep-submicron regime for higher integration density and performance. The scaling of critical dimensions, such as the gate length of a field effect transistor, may, however, entail significant changes of related features, and of respective process sequences for manufacturing these features, in order to not unduly offset the advantages obtained by reducing the critical dimensions. For example, upon reducing the gate length and, thus, the channel length of a field effect transistor, thinner gate dielectrics, i.e., gate insulation layers separating the gate electrode from the channel region, are required to provide sufficient current drive capability since the supply voltage is also to be scaled down.

Generally, the desired high performance of these modern CMOS devices requires maximizing the inversion charge formed in the channel region under the control of a voltage applied to the gate electrode and the drive current of the device. To achieve this effect, it is necessary to maximize the capacitive coupling between the gate electrode, usually formed of polysilicon, and the channel formed adjacent to the gate insulation layer. This is generally accomplished, as pointed out above, by thinning the gate insulation layer that separates the channel from the gate electrode. In sophisticated integrated circuits that include transistor elements with a gate length of 0.25 $\mu$m or even less, ultra-thin dielectrics with a thickness of less than 2 nm may be required as gate insulation layers to ensure the required drive current capability. Reducing the thickness of the gate insulation layer, however, involves a significant increase of leakage currents through the gate insulation layer.

A further characteristic influencing the effective gate capacitance is associated with the capacitive component of a depletion layer in the gate electrode, which forms when the gate electrode is biased to form an inversion layer in the channel. Generally, the gate electrode is heavily doped to increase the conductivity of the gate electrode, and the depletion layer is caused by the reduced dopant concentration that is created during the implant of the dopants and the subsequent anneal cycles for diffusing the dopants and curing crystal damage, since the strict process requirements for sophisticated semiconductor devices do not allow a desired high and uniform dopant concentration to be obtained throughout the entire gate electrode. Especially in deep-submicron devices, the contribution of a large depletion layer may overcompensate the effect achieved by thinning the gate insulation layer, and the resulting device may, therefore, suffer from a reduced capacitive coupling. Due to the exponential increase of the associated leakage currents in transistors with a thin gate insulation layer, it may, therefore, be important to keep the depletion layer of the gate electrode as small as possible.

The depletion layer may successfully be minimized by increasing the doping level of the gate electrode. However, in case of PMOS (P-channel metal-oxide semiconductor) devices having boron-doped gate electrodes, an increased doping level of the gate electrode is typically associated with a penetration of boron through the gate insulation layer. The penetration of boron results in a degradation of the reliability of the gate insulation layer owing to damage caused by the boron atoms. Moreover, a shift of the threshold voltage ($V_T$) may occur due to the altered doping levels in the channel. This is especially true for thin gate dielectrics with a thickness of less than 4 nm. With such thin gate insulation layers, the gate-depletion effect and boron penetration are critical and place severe constraints on the doping and the annealing conditions of the gate electrode.

To deal with the problem of boron penetration, it has been suggested to fill the polysilicon grain boundaries, which serve as the main diffusion path, with nitrogen. For an effective barrier to reduce the gate depletion layer, it is necessary to place a high dose of nitrogen close to the interface of the polysilicon gate electrode and the gate insulation layer. Typically, the nitrogen is ion implanted and implant energies on the order of several kilo-electron volts (keV) are required. This ion implant conventionally suffers from the problem that either nitrogen atoms penetrate into the channel where they reduce the carrier mobility and tend to reduce the device reliability, or that the nitrogen peak concentration is located too far from the interface between the polysilicon gate electrode and the gate insulation layer, thereby creating a relatively wide depletion layer.

In order to illustrate the problems discussed above in more detail, a typical prior art processing sequence for the manufacture of a PMOS transistor is described with reference to FIGS. 1a–1c and FIG. 2. For convenience, only the process steps relevant for the present invention are shown.

FIG. 1a schematically shows a cross-sectional view of a semiconductor structure 100 comprising a substrate 101 with shallow trench isolation (STI) regions 112 formed therein, which define an active region, which will be referred to as N-well 110, in and over which a P-channel transistor is to be formed. A gate insulation layer 114 is formed on the substrate 101 with a layer of polysilicon 116 formed on the gate insulation layer 114. Forming the STI regions 112 followed by a plurality of implantation steps for defining the N-well 110, the growth or deposition of the gate insulation layer 114 and the deposition of the polysilicon layer 116 are carried out by well-established processes and will not be described in detail herein.

FIG. 1b shows the semiconductor structure 100 during an implant process 118 for introducing nitrogen either in atomic or molecular form ($N_{14}$ or $N_{28}$) into the polysilicon layer 116. Typically, implant energies of several keV are used to implant the nitrogen, wherein the localization of a peak concentration of nitrogen within the polysilicon layer 116 is difficult to be controlled, as will be discussed in more detail below with reference to FIG. 2.

FIG. 1c shows the semiconductor structure 100 with a PMOS transistor 120 formed in and on the N-well 110. The completed PMOS transistor 120 includes a source region 123 and a drain region 124, a portion of the gate insulation layer, denoted by 114a, a gate electrode 126, and a sidewall spacer 128. The shading of the gate electrode 126 indicates the local nitrogen concentration arising from the nitrogen implant 118, which can be seen clearer in the graph of FIG. 2.

FIG. 2 schematically shows the nitrogen concentration represented by curves 230, 232 and 234, respectively, on the ordinate versus the depth z on the abscissa, for three different implant energies, taken along the line 122 of FIG. 1c. A depth of z=0 corresponds to the top surface 129 of the gate electrode 126. The relatively high energies associated with conventional ion implantation represent a significant challenge with respect to accurate positioning of the nitrogen peak concentration within the polysilicon layer 116 and, thus, within the gate electrode 126, since the depth distribution of the nitrogen atoms depends on the initial implantation energy.

In order to obtain a desired high concentration of dopants for improving the conductivity of the gate electrode 126 even in the vicinity of the gate insulation layer 114a, it is necessary to place the location of the peak concentration of nitrogen acting as a diffusion barrier as closely as possible to the gate insulation layer 114a. Curve 234 represents a nitrogen depth distribution having its peak concentration, or at least a relatively high nitrogen concentration, close to the gate insulation layer 114a. Due to the wide variation in the depth direction of the implanted nitrogen ions, the amount of nitrogen ions penetrating through the gate insulation layer 114a into the N-well 110 is drastically increased as the peak is placed relatively close to the gate insulation layer 114a. This penetration may severely affect the quality of the (very thin) gate insulation layer 114a, thereby reducing device reliability, and may also result in reduced transistor performance owing to a reduced carrier mobility in the N-well 110. If, on the other hand, the nitrogen peak is placed sufficiently far away from the gate insulation layer 114a to substantially avoid nitrogen penetration into and through the gate insulation layer 114a, as illustrated by curve 230, the boron dopants will be blocked too far from the gate insulation layer 114a, thereby creating a lightly doped zone between the peak position and the gate dielectric, which in turn leads to a severe gate depletion during transistor operation, thereby reducing the capacitive coupling between the channel and the gate electrode 126 and, thus, decreasing the current drive capability of the transistor 120.

In the conventional implantation process, it may, thus, be extremely difficult to establish an implantation scheme so as to place a sufficiently high nitrogen dose close enough to the gate insulation layer 114a without causing severe reliability and performance degradation, as is represented by curve 232. Thus, in conventional processing, the intricacy to achieve a satisfactory distribution is associated with the difficulty to accurately position the peak concentration of the nitrogen distribution close to the gate insulation layer 114a without unduly penetrating it.

In view of the above explained problems, a need exists for a an improved semiconductor device in which a desired dopant concentration may be obtained within a specified device region without unduly affecting an adjacent region.

SUMMARY OF THE INVENTION

Generally, the present invention is directed to creating a highly localized diffusion or penetration barrier showing a delta spike-like distribution at a well-defined location within a polysilicon region so that the polysilicon region may receive a high dopant concentration to improve conductivity, wherein the delta spike-like barrier efficiently hinders dopants to penetrate adjacent regions.

According to one illustrative embodiment of the present invention, a method of forming a localized implantation barrier in a polysilicon line comprises depositing a first polysilicon layer on a substrate and exposing the substrate to a reactive ambient including nitrogen to introduce nitrogen into the first polysilicon layer. Then, a second polysilicon layer is deposited on the first polysilicon layer. Next, the first and second polysilicon layers are patterned to form the polysilicon line.

In a further illustrative embodiment, a method of forming a gate electrode of a field effect transistor comprises providing a substrate having formed thereon a semiconductor region and depositing a gate insulation layer on the semiconductor region. A first polysilicon layer is deposited on the gate insulation layer with a predefined thickness and is doped with nitrogen to form a penetration barrier within the first polysilicon layer. Next, a second polysilicon layer is deposited over the first polysilicon layer, and the first and second polysilicon layers are patterned to form the gate electrode. Next, the gate electrode is doped with a dopant to increase the conductivity of the gate electrode, wherein the penetration barrier reduces penetration of the gate insulation layer by dopants.

In a further illustrative embodiment, a method of forming a gate electrode for a field effect transistor comprises providing a substrate including a semiconductive region with a gate insulation layer formed on the semiconductive region. The method further comprises maintaining a vacuum around the substrate while performing a process sequence including: (i) depositing a polysilicon layer on the gate insulation layer to a first thickness; (ii) incorporating nitrogen into the polysilicon layer to form a diffusion barrier in the polysilicon layer; and (iii) resuming deposition of polysilicon to form a final polysilicon layer with a second thickness. The method further comprises doping the final polysilicon layer having the second thickness with a dopant to increase the conductivity of the polysilicon layer.

In a further illustrative embodiment, a semiconductor device comprises a substrate having formed thereon an active semiconductor region and an insulation layer formed at least partially on the active semiconductor region. A polysilicon region is formed on the insulation layer, wherein the polysilicon region contains nitrogen that forms a barrier layer. A nitrogen concentration peak is located at a distance of approximately 0–20 nm from an interface between the insulation layer and the polysilicon region.

In a further illustrative embodiment of the present invention, a field effect transistor formed on a substrate having an active region formed thereon comprises a gate insulation layer formed on the active region. A gate electrode is formed on the active region, wherein the gate electrode comprises a first polysilicon layer having a first thickness and located adjacent to the gate insulation layer and a second polysilicon layer having a second thickness and located on the first polysilicon layer. The first polysilicon layer further includes a nitrogen-containing diffusion barrier, wherein the first thickness is less than the second thickness. The transistor further comprises a source region and a drain region formed in the active region.

In another embodiment of the present invention, a field effect transistor formed on a substrate comprises a gate electrode formed over the substrate and a gate insulation layer formed between an active region and the gate electrode. A source region and a drain region are formed in the active region and a barrier region containing nitrogen is formed in the gate electrode close to the gate insulation layer, such that a distance of a nitrogen peak concentration from the gate insulation layer is in the range of approximately 0–20 nm.

BRIEF DESCRIPTION OF THE DRAWINGS

The invention may be understood by reference to the following description taken in conjunction with the accompanying drawings, in which like reference numerals identify like elements, and in which.

Figure 1A:
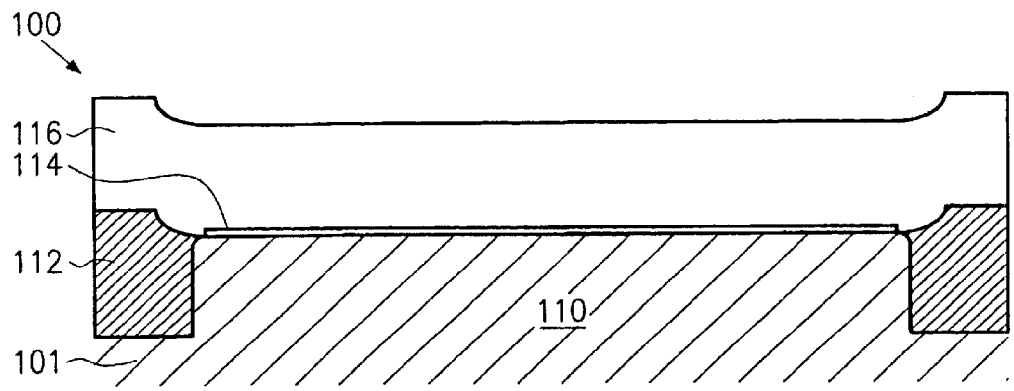
FIGS. 1a–1c schematically show cross-sectional views of a PMOS transistor during various manufacturing stages, formed according to a typical prior art process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

It is to be noted that, in the following detailed description, reference is made to a P-channel field effect transistor, in which the gate electrode is highly doped to compensate for the gate depletion occurring in conventional submicron devices. Although the principles of the present invention are especially advantageous for such sophisticated P-channel transistors, the present invention may as well be applied in situations requiring a highly localized diffusion or penetration barrier for a subsequent dopant implantation for adjusting the conductivity of a circuit feature. For instance, polysilicon lines may need to be doped for an improved conductivity wherein an underlying material must not be affected by the implanted ions. In other applications, MOS transistors, such as NMOS, PMOS and CMOS transistors, may require improved drive current capabilities, so that the gate electrode thereof may be subjected to a high dose implantation for reducing the gate depletion zone, wherein a delta-like barrier region protects sensitive gate insulation and channel regions.

Figure 3A:
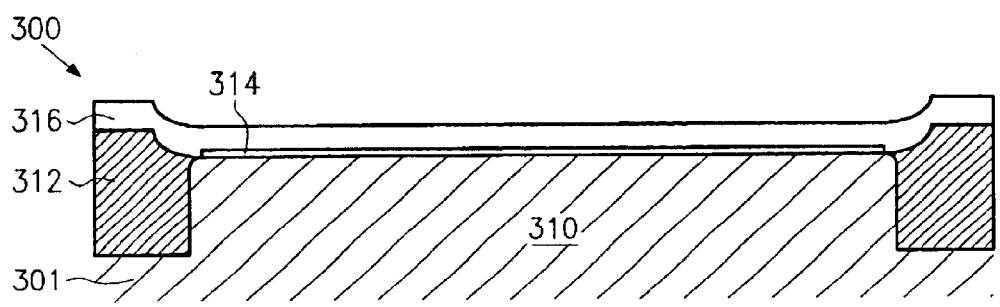
FIGS. 3a–3d schematically show cross-sectional views of a PMOS transistor during various manufacturing stages, formed according to an illustrative embodiment of the present invention.

Illustrative embodiments of the present invention will now be described with reference to FIGS. 3a–3d and 4. As shown in FIG. 3a, a semiconductor structure 300 comprises a substrate 301, which may be any appropriate substrate, such as a silicon wafer, an SOI (silicon-on-insulator) substrate, and the like. The substrate includes a semiconductive active region 310 that may have an appropriate dopant concentration to form a P-channel transistor therein and thereon. The active region 310 is enclosed by shallow trench isolations 312. A gate insulation layer 314 is formed on the active region 310 and a first layer 316 of gate electrode material, such as polysilicon, is formed on the gate insulation layer 314. The first polysilicon layer 316 may have a first thickness of about 10 nm. In other embodiments, the first thickness may be in the range of approximately 5–20 nm.

The process flow for forming the semiconductor structure depicted in FIG. 3a may be similar to conventional processing, except for the deposition of the first layer 316. In depositing the first layer 316 by, for example, chemical vapor deposition (CVD), such as low pressure CVD, process parameters are controlled to substantially obtain the first thickness. Since a corresponding deposition process is well-known in the art, a description thereof is omitted.

Figure 3B:
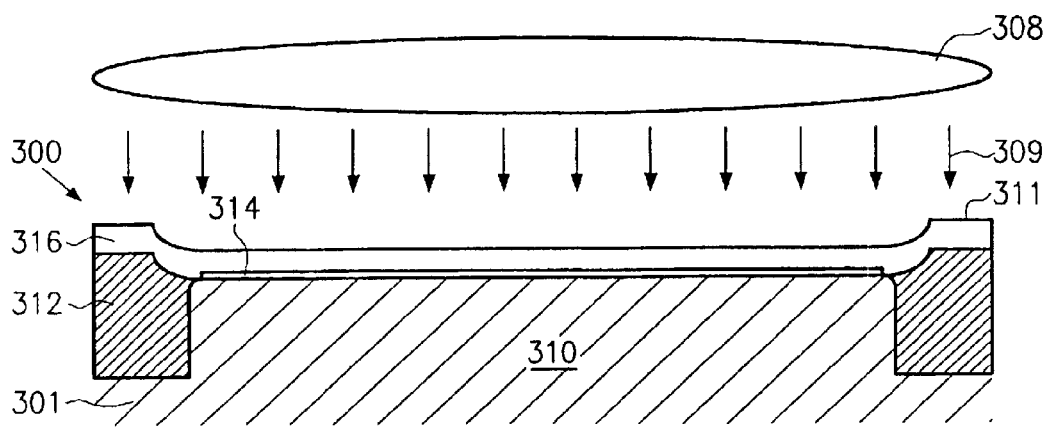

FIG. 3b shows the semiconductor structure 300 exposed to a nitrogen-containing plasma ambient 308. The plasma ambient 308 may be established by any appropriate process tool allowing the generation and control of a plasma. For example, deposition tools for plasma enhanced CVD, plasma etch tools, even deposition tools with a remote plasma generation source, may be used. In one embodiment, the plasma ambient 308 may be maintained and/or an energy and/or the directionality of ions may be controlled by a DC potential applied between the plasma ambient 308 and the substrate 301. In one particular embodiment, the DC potential ranges from approximately 5–100 V. During exposure of the substrate 301 to the plasma ambient 308, nitrogen ions and nitrogen radicals 309 impinge with relatively low kinetic energy, compared to several keV of the prior art processing, on the first layer 316. Thereby, nitrogen is introduced into the first layer 316 both by implantation of ionized nitrogen and also by chemical reaction of the polysilicon in the first layer 316 with nitrogen radicals. Due to the low kinetic energy of those nitrogen particles 309 that are introduced by an implantation effect, the penetration depth is extremely small and, thus, the concentration of the penetrating nitrogen particles 309 is substantially located at a surface 311 of the first layer 316. The gate insulation layer 314 remains substantially unaffected by the penetrating nitrogen particles 309.

Next, according to one embodiment, a cleaning process is carried out to remove oxide that may have formed on the surface 311 of the first layer 316 during the handling of the substrate between the deposition of the first layer 316 and the exposure to the plasma ambient 308. A wet chemical clean process using diluted hydrogen fluoride (HF) may be carried out. In a further embodiment, the deposition of the first layer 316 including a possible wafer transport or handling and the exposure to the plasma ambient 308 may be performed in a common vacuum ambient without breaking the vacuum.

Figure 3C:
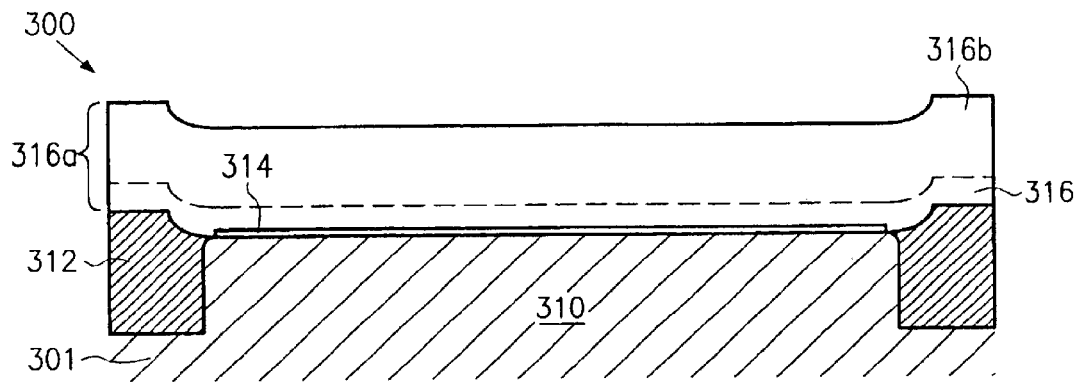

FIG. 3c depicts the semiconductor structure 300 with the final gate electrode material layer 316a having a second thickness in the range of approximately 100–300 nm. The final layer 316a is formed by continuing the deposition of the gate electrode material forming the first layer 316 to thereby deposit a second layer 316b. When the vacuum can be maintained during the deposition of the first layer 316, the exposure to the plasma ambient 308 and the continuation of the deposition to obtain the final layer 316a, the cleaning process described above may not be required, thereby reducing process time and thus improving production yield. After completion of the deposition of the gate electrode material, the final layer 316a comprises a first portion corresponding to the first layer 316 having a high nitrogen concentration and a second portion 316b substantially without nitrogen. As will readily be appreciated, a distance of a peak concentration of nitrogen within the first layer 316 may be controlled by suitably selecting the first thickness of the first layer 316. For example, a value of approximately 5 nm for the first thickness may place the nitrogen peak to about 5 nm apart from the gate insulation layer 314 as the major part of the nitrogen particles is located at the surface 311 of the first layer 316. In order to minimize penetration of nitrogen into the gate insulation layer 314, the plasma ambient 308 may then be controlled to limit the kinetic energy of the nitrogen particles to a value that does not allow nitrogen particles to pass through the entire first layer 316. To this end, the DC potential may be adjusted to a corresponding low value of, for example, about 0.5–25 V.

Figure 3D:
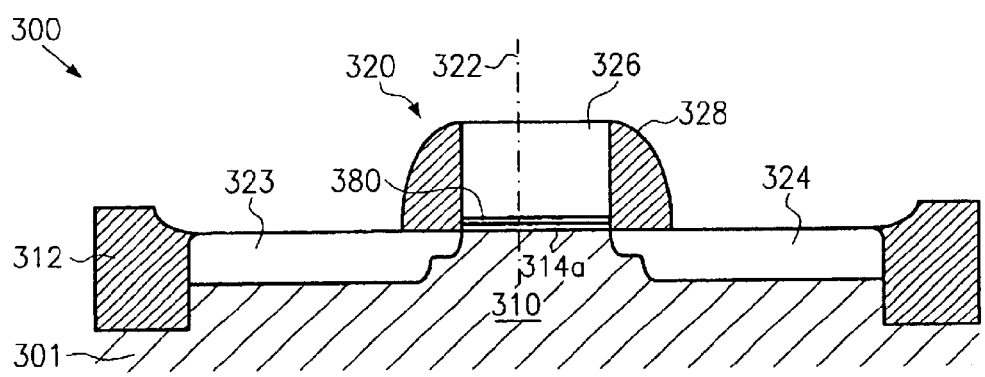

FIG. 3d schematically shows the semiconductor structure 300 having formed therein a P-channel transistor 320 including a source region 323, a drain region 324, a patterned gate insulation layer 314a, a gate electrode 326 and sidewall spacers 328. As in the conventional manufacturing process, the transistor 320 may be formed by patterning the final layer 316a including sophisticated lithography and etch techniques and forming the source and drain regions 324, 323 by ion implantation, including the formation of the spacers 328 between a light dose and a heavy dose implantation step, wherein the gate electrode 326 is also doped with boron. Due to the nitrogen in the first layer 316 forming an effective diffusion barrier, also indicated by 380, in the gate electrode 326, penetration of boron ions into the gate insulation layer 314a during the implantation and subsequent anneal for activating the dopants and curing lattice damage is significantly reduced.

Figure 1B:
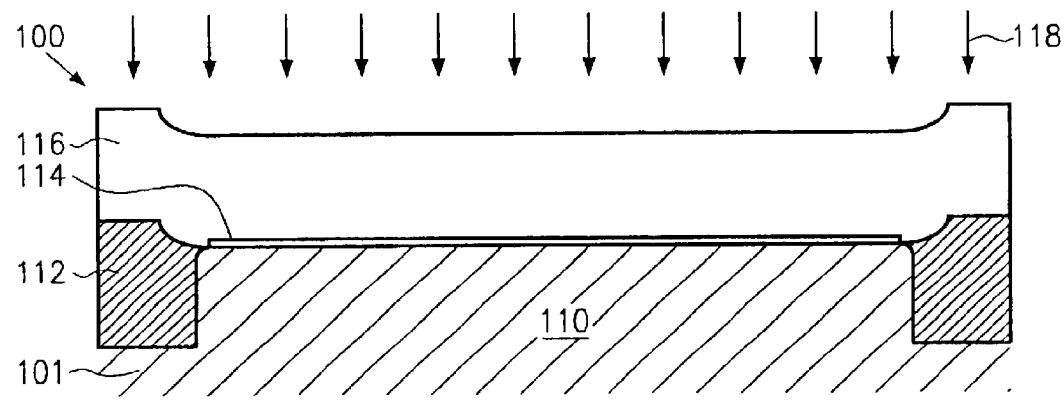
Figure 1C:
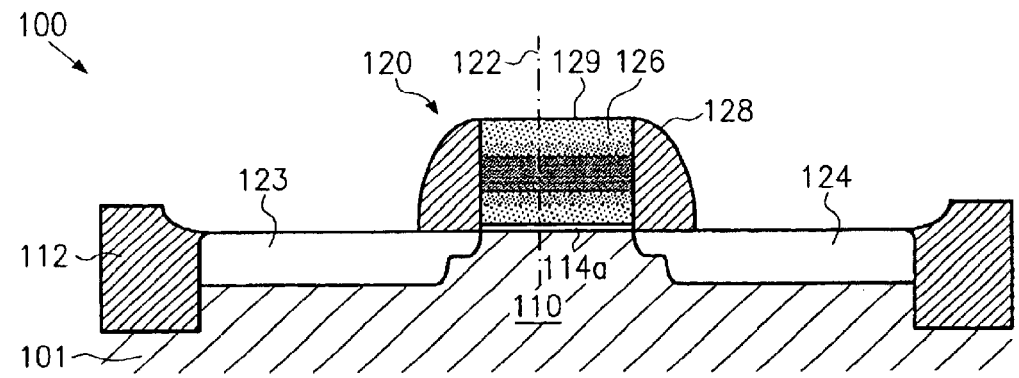
Figure 2:
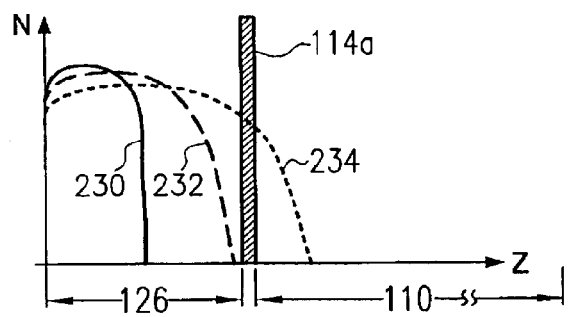
FIG. 2 schematically shows, for the prior art process of FIGS. 1a–1c, the nitrogen concentration for three different implant energies on the ordinate versus the depth z on the abscissa, taken along the line 122 of FIG. 1c.
Figure 4:
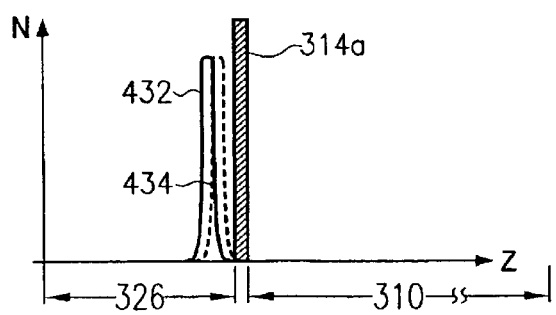
FIG. 4 schematically shows, analogous to FIG. 2, the nitrogen concentration for two implant energies for the process shown in FIGS. 3a–3d.

FIG. 4 schematically shows the nitrogen concentration N on the ordinate versus the depth z on the abscissa, taken through the gate electrode 326 along the line 322 of FIG. 3d. The nitrogen concentration for the barrier layer 380 is shown as curve 432. Due to the combination of chemical interaction between the polysilicon and the nitrogen radicals and due to the very low energy of the nitrogen ions in the plasma ambient 308, the nitrogen distribution is extremely shallow compared to the conventional ion implantation as described in connection with FIGS. 1a–1c. Therefore, the barrier layer 380 may be provided in a delta peak-like manner with a very high concentration to effectively shield the grain boundaries of the polysilicon, thereby effectively blocking the main diffusion path of boron. In one embodiment, the nitrogen concentration is $5 \times 10^{21}$ atoms/cm$^3$ or higher at a distance from the gate insulation layer 314a in the range of about 0–20 nm, whereas the boron concentration is less than $10^{15}$ atoms/cm$^3$ within this range and rapidly increases to $10^{21}$ atoms/cm$^3$ or higher for a distance greater than approximately 30 nm from the gate insulation layer 314a.

Curve 434 shows the nitrogen distribution of the barrier layer 380 for a further embodiment, wherein the distance to the gate insulation layer 314a is approximately 5 nm. The nitrogen concentration and the boron concentration may take on the same values as described above.

As a result, according to the present invention, a delta spike-like concentration of a barrier layer can thus be realized in the very vicinity of the interface of the gate electrode 326 and the gate insulation layer 314a. This allows the boron dopants, introduced to increase the conductivity of the polysilicon gate electrode, to diffuse through almost the entire depth of the gate electrode 326 up to the nitrogen peak position, i.e., the barrier layer 380. The nitrogen peak in the vicinity of the interface acts as a diffusion barrier for the boron dopants during implanting and activating the boron ions. This successfully avoids boron penetration and therefore allows extremely high boron concentrations to be utilized in the gate electrode 326 to minimize gate depletion, as the spacing between the peak position and the gate insulation layer 314a is minimized.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a localized implantation barrier in a polysilicon line, the method comprising:

depositing a first polysilicon layer on a substrate;

establishing a nitrogen-containing plasma ambient;

exposing the first polysilicon layer to said nitrogen-containing plasma ambient to introduce nitrogen into the first polysilicon layer;

depositing a second polysilicon layer on the first polysilicon layer, wherein the process sequence including depositing the first polysilicon layer, exposing the first polysilicon layer to the nitrogen-containing plasma ambient and depositing the second polysilicon layer is carried out in a common vacuum without breaking the vacuum during said process sequence; and patterning the first and second polysilicon layers to form the polysilicon line.

2. The method of claim 1, wherein a thickness of the first polysilicon layer is in the range of approximately 5–20 nm.

3. The method of claim 1, further comprising doping said polysilicon line by ion implantation, wherein said introduced nitrogen acts as the implantation barrier for the dopants introduced during the ion implantation.

4. The method of claim 3, wherein said dopants comprise boron.

5. The method of claim 1, further comprising controlling one of an energy and directionality of ions in said nitrogen-containing plasma ambient.

6. The method of claim 5, wherein a DC bias is established within said plasma ambient, wherein a kinetic energy of the ions in the plasma ambient is maintained below an upper limit required for passing through an approximately 5 nm thick polysilicon line.

7. The method of claim 6, wherein said DC bias is in the range of approximately 0.5–100 volts.

8. The method of claim 1, further comprising cleaning the first polysilicon layer prior to depositing the second polysilicon layer to substantially remove oxide from a surface of the first polysilicon layer.

9. The method of claim 1, wherein a width dimension of said polysilicon line is approximately 0.25 μm or less.

10. A method of forming a gate electrode for a field effect transistor, the method comprising:

providing a substrate having formed thereon a semiconductor region;

depositing a gate insulation layer on the semiconductor region;

depositing a first polysilicon layer on said gate insulation layer with a predefined thickness;

establishing a nitrogen-containing plasma ambient;

exposing said first polysilicon layer to said nitrogen-containing plasma ambient to introduce nitrogen into said first polysilicon layer and thereby form a penetration barrier within said first polysilicon layer;

depositing a second polysilicon layer over the first polysilicon layer, wherein the process sequence including depositing the first polysilicon layer, exposing the first polysilicon layer to the nitrogen-containing plasma ambient and depositing the second polysilicon layer is carried out in a common vacuum without breaking the vacuum during said process sequence;

patterning the first and second polysilicon layers to form the gate electrode; and doping the gate electrode with a dopant material to increase the conductivity of said gate electrode, wherein said penetration barrier reduces penetration of the gate insulation layer by said dopant material.

11. The method of claim 10, wherein said dopant material comprises boron.

12. The method of claim 11, wherein said nitrogen-containing plasma ambient is controlled to maintain a kinetic energy of nitrogen ions below an energy level required to pass through said first polysilicon layer having the predefined thickness.

13. The method of claim 11, wherein said nitrogen-containing plasma ambient is maintained at a DC potential between said semiconductor substrate and the plasma of about 0.5–100 volts, whereby both implantation of ionized nitrogen and chemical reaction of the polysilicon layer with nitrogen radicals occurs.

14. The method of claim 10, wherein said step of exposing said first polysilicon layer to said nitrogen-containing plasma ambient is followed by a cleaning process to remove a native oxide from the first polysilicon layer.

15. The method of claim 10, wherein said source and drain regions are doped simultaneously with doping said gate electrode.

16. The method of claim 10, wherein said predefined thickness is in the range of about 5–20 nanometers.

17. The method of claim 10, wherein said gate electrode has a gate length of 0.25 µm or less.

18. A method of forming a gate electrode for a field effect transistor, the method comprising:

providing a substrate including a semiconductive region with a gate insulation layer formed on the semiconductive region;

maintaining a vacuum around said substrate while performing a process sequence including:
(i) depositing a first polysilicon layer on said gate insulation layer to a first thickness;
(ii) incorporating nitrogen into said first polysilicon layer to form a diffusion barrier in said polysilicon layer; and
(iii) resuming deposition of polysilicon on said first polysilicon layer to form a final polysilicon layer with a second thickness; and doping said final polysilicon layer having the second thickness with a dopant to increase the conductivity of said final polysilicon layer.

19. The method of claim 18, wherein the final polysilicon layer is doped with boron.

20. The method of claim 19, wherein a peak concentration of boron is in the range of approximately $10^{19}$–$10^{21}$ atoms/cm$^3$.

21. The method of claim 18, wherein nitrogen is incorporated into said first polysilicon layer by establishing a nitrogen-containing plasma ambient.

22. The method of claim 21, wherein said nitrogen-containing plasma ambient is maintained with a DC potential between said semiconductor substrate and the plasma of about 0.5–100 volts, whereby both implantation of ionized nitrogen and chemical reaction of the first polysilicon layer with nitrogen radicals occurs.

23. The method of claim 18, wherein said first thickness is between about 5–20 nanometers.

24. The method of claim 18, wherein said second thickness is between about 100–300 nanometers.

* * * * *